United States Patent
Groetsch et al.

(10) Patent No.: US 8,754,427 B2
(45) Date of Patent: Jun. 17, 2014

(54) LENS ARRANGEMENT AND LED DISPLAY DEVICE

(75) Inventors: Stefan Groetsch, Lengfeld-Bad Abbach (DE); Moritz Engl, Regensburg (DE); Steffen Koehler, Regensburg (DE); Simon Bluemel, Schierling (DE); Michael Hiegler, Mutlangen (DE); Thomas Zeiler, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 452 days.

(21) Appl. No.: 12/520,007

(22) PCT Filed: Dec. 21, 2007

(86) PCT No.: PCT/DE2007/002321
§ 371 (c)(1),
(2), (4) Date: Sep. 23, 2009

(87) PCT Pub. No.: WO2008/080390
PCT Pub. Date: Jul. 10, 2008

(65) Prior Publication Data
US 2010/0038666 A1     Feb. 18, 2010

(30) Foreign Application Priority Data
Dec. 29, 2006    (DE) .................. 10 2006 062 066

(51) Int. Cl.
*H01L 33/00*      (2010.01)
*G02B 7/02*      (2006.01)
*H01L 33/58*      (2010.01)

(52) U.S. Cl.
CPC ............. *G02B 7/028* (2013.01); *H01L 33/58* (2013.01)
USPC ............ 257/98; 257/E33.067; 257/E33.073; 257/E33.061; 257/E33.071

(58) Field of Classification Search
None
See application file for complete search history.

(56) References Cited

U.S. PATENT DOCUMENTS

| | | | |
|---|---|---|---|
| 3,671,108 A | 6/1972 | Kilgus | |
| 4,041,222 A | 8/1977 | Schoeppl et al. | |
| 5,253,111 A | 10/1993 | Chiba et al. | |
| 5,985,696 A | 11/1999 | Brunner et al. | |
| 6,188,841 B1 | 2/2001 | Kamata | |
| 2001/0001241 A1 | 5/2001 | Kawakami et al. | |
| 2002/0130326 A1* | 9/2002 | Tamura et al. | 257/79 |
| 2004/0041222 A1 | 3/2004 | Loh | |
| 2004/0079957 A1* | 4/2004 | Andrews et al. | 257/100 |
| 2004/0190304 A1* | 9/2004 | Sugimoto et al. | 362/555 |
| 2005/0072981 A1* | 4/2005 | Suenaga | 257/88 |

(Continued)

FOREIGN PATENT DOCUMENTS

| | | |
|---|---|---|
| CN | 2613055 Y | 4/2004 |
| DE | 102 61 974 A1 | 2/2004 |

(Continued)

*Primary Examiner* — Benjamin Sandvik
*Assistant Examiner* — Leslie Pilar Cruz
(74) *Attorney, Agent, or Firm* — Slater & Matsil, L.L.P.

(57) ABSTRACT

A lens arrangement for an LED display device includes a lens. The lens has a first lens surface and an optical axis. The optical axis penetrates the first lens surface of the lens. Furthermore, the lens arrangement includes a transparent transition body, which is firmly coupled with the lens on the first lens surface, which is more temperature-resistant than the lens and which has an optical axis that is parallel to the optical axis of the lens.

18 Claims, 2 Drawing Sheets

(56) References Cited

U.S. PATENT DOCUMENTS

| | | | |
|---|---|---|---|
| 2005/0168987 A1 | 8/2005 | Tamaoki et al. | |
| 2005/0174779 A1 | 8/2005 | Yoneda et al. | |
| 2005/0201109 A1 | 9/2005 | Shimura | |
| 2005/0218421 A1* | 10/2005 | Andrews et al. | 257/100 |
| 2005/0221519 A1* | 10/2005 | Leung et al. | 438/27 |
| 2005/0280014 A1* | 12/2005 | Park et al. | 257/98 |
| 2006/0091411 A1 | 5/2006 | Ouderkirk et al. | |
| 2006/0091784 A1* | 5/2006 | Conner et al. | 313/498 |
| 2006/0097358 A1 | 5/2006 | Udagawa | |
| 2006/0097385 A1 | 5/2006 | Negley | |
| 2006/0187653 A1 | 8/2006 | Olsson | |
| 2006/0264567 A1* | 11/2006 | Shiobara et al. | 524/588 |
| 2007/0085103 A1* | 4/2007 | Nishioka et al. | 257/99 |
| 2008/0048199 A1* | 2/2008 | Ng | 257/98 |
| 2008/0054288 A1* | 3/2008 | Harrah et al. | 257/99 |
| 2008/0224159 A1 | 9/2008 | Krauter et al. | |

FOREIGN PATENT DOCUMENTS

| | | |
|---|---|---|
| DE | 10 2005 036 520 A1 | 11/2006 |
| EP | 1 081 771 A2 | 3/2001 |
| EP | 1 691 425 A1 | 8/2006 |
| JP | 03-110963 | 5/1991 |
| JP | 2000-200929 | 7/2000 |
| JP | 2003-110146 A | 11/2003 |
| TW | 398085 B | 7/2000 |
| TW | 456588 U | 9/2001 |
| TW | 504554 B | 10/2002 |
| WO | WO 2004/032250 A1 | 4/2004 |
| WO | WO 2005/053041 A1 * | 6/2005 |
| WO | WO 2005/083804 A1 | 9/2005 |
| WO | 2006114082 A2 | 11/2006 |

* cited by examiner

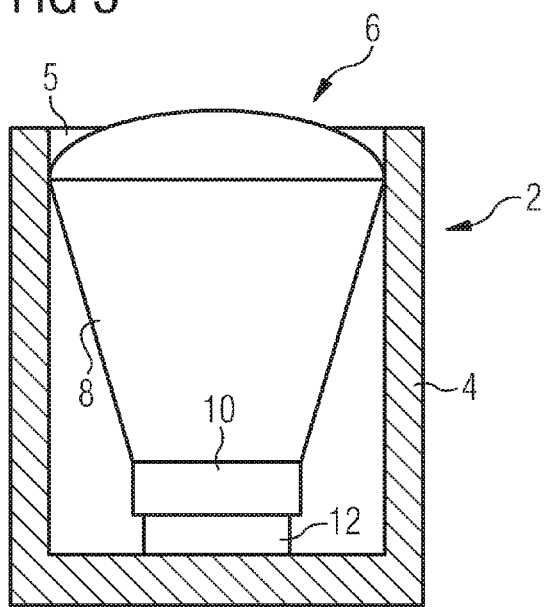
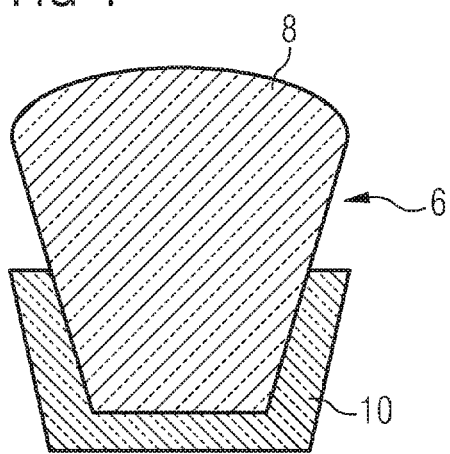
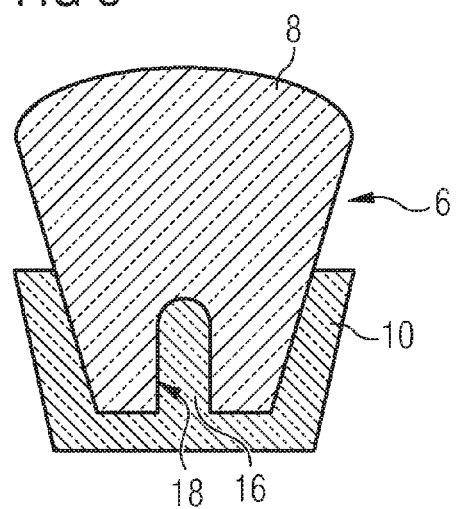

LENS ARRANGEMENT AND LED DISPLAY DEVICE

This patent application is a 371 filing of PCT/DE2007/002321, filed Dec. 21, 2007, which claims the priority of German Patent Application No. 10 2006 062 066.6, filed Dec. 29, 2006, the disclosure content of which is hereby incorporated by reference.

TECHNICAL FIELD

The invention concerns a lens arrangement for an LED display device.

BACKGROUND

As light sources, LEDs are more and more frequently preferred. LEDs are characterized by a high luminous efficacy with a low energy requirement. In comparison with a normal light bulb, LEDs regularly produce far less heat with a comparable luminous efficacy. Nevertheless, when operating the LED, very high temperatures appear in the vicinity of the LED.

SUMMARY

In one aspect, the invention creates a lens arrangement for an LED display device, which makes possible a coupling of the lens arrangement to a thermally burdened area.

In one embodiment, the lens arrangement comprises a lens that has a first lens surface and an optical axis. The optical axis penetrates the first lens surface of the lens. Furthermore, the invention concerns the LED display device. The LED display device has a housing, which comprises an opening. At least one LED is placed in the housing in such a way that radiation that is radiated in a main radiation direction of the LED passes through the opening of the housing.

In accordance with a first aspect, the invention is characterized by a lens arrangement for an LED display device. The lens arrangement comprises a lens and a transparent transition body. The lens has a first lens surface and an optical axis. The optical axis of the lens penetrates the first lens surface of the lens. The transparent transition body is firmly coupled with the lens on the first lens surface. The transparent transition body is more temperature-resistant than the lens and has an optical axis that is parallel to the optical axis of the lens.

If the lens arrangement is provided to collimate and/or focus the radiation of a hot light source, this makes it possible to place the lens arrangement close to the light source and in such a way that the transparent transition body is placed between the lens and the light source. Furthermore, this makes it possible to take into consideration, primarily, optical characteristics and/or a plasticity and/or a stability of shape of the corresponding material when selecting a material for the lens and to give less consideration to the thermal characteristics.

The transparent transition body, which is more temperature-resistant than the lens, protects the lens not only from thermal influences that arise due to the radiation radiated from the light source, but also can simultaneously protect the lens from radiation-based influences. "Radiation-based influences" are to be understood below as influences that can arise due to the radiation density of the radiation radiated from the light source.

The lens can be protected from radiation-based influences by the transparent transition body, since the lens is placed at a distance from the light source. Thus, the lens is protected from the high radiation density that appears close to the light source and that can lead to the destruction of the material of the lens. Due to the distance of the lens from the light source, which distance arises in that the transparent transition body is placed between the lens and the light source, the radiation density at the lens is reduced. In the selection of a material for the lens, therefore, the radiation sensitivity of the corresponding material is to be considered only marginally. In this way, materials that are sensitive to high radiation densities, such as plastic materials, can be used for the lens.

In an advantageous development of the first aspect of the invention, the optical axis of the lens corresponds to the optical axis of the transparent transition body. The two optical axes form an optical axis of the lens arrangement. This contributes to a particularly precise collimation and/or focusing of the radiation by the lens arrangement.

In another advantageous development of the first aspect of the invention, the lens is more dimensionally stable than the transparent transition body. This makes possible a particularly precise formation of the shape of the lens and thus the attaining of a particularly precise guiding and/or shaping of a beam by the lens. Furthermore, this makes possible a particularly good coupling of the transparent transition body with the lens and with the radiation device, for example, the LED display device, which comprises at least the light source, for example, the LED.

In another advantageous development of the first aspect of the invention, the transition body surrounds the lens, at least in part, in a radial direction. This contributes to shielding the lens even better from the heat of the light source. Furthermore, in this way, a particularly good coupling can be attained between the lens and the transparent transition body.

In another advantageous development of the first aspect of the invention, the lens has at least one recess. The transition body has at least one holding body that protrudes into the recess of the lens. This contributes to a particularly good coupling between the lens and the transparent transition body. Furthermore, an additional shaping clearance is opened with regard to the guiding of a beam in the lens arrangement.

In accordance with a second aspect of the invention, the invention is characterized by the LED display device. The LED display device has a housing, at least one LED, and at least the lens arrangement. The housing comprises an opening. The LED is placed in the housing in such a way, that radiation that is radiated in a main radiation direction of the LED, exits through the opening of the housing. The lens arrangement is placed in such a way that the radiation emitted by the LED in the main radiation direction penetrates the transition body and the lens. The radiation can also be reflected by a reflector before it exits from the housing.

In an advantageous development of the second aspect of the invention, the transparent transition body has a prespecified positive distance to the LED. This can contribute such that a radiation density of the radiation radiated from the LED display device is higher, and such that the radiation is radiated to a surface that is smaller in comparison to an LED display device, in which the transition body is directly coupled with the LED and/or a casting compound in which the LED is embedded.

In another advantageous development of the second aspect of the invention, the LED is sheathed, at least in part, by a transparent casting compound. This makes it possible to protect and affix the LED in a simple manner. Furthermore, this makes it possible, if the casting compound is placed between the transparent transition body and the LED, for the radiation to be radiated to a surface that is larger in comparison to an LED display device, in which a casting compound is not provided between the transition body and the LED.

BRIEF DESCRIPTION OF THE DRAWINGS

The invention is explained in more detail, below, with the aid of schematic drawings.

FIG. 3, shows a third embodiment of the LED display device;

FIG. 4, shows a first embodiment of a lens arrangement; and

FIG. 5, shows a second embodiment of the lens arrangement.

Elements of the same construction or function are characterized, where the figures overlap, with the same reference symbols.

DETAILED DESCRIPTION

Figure 1:
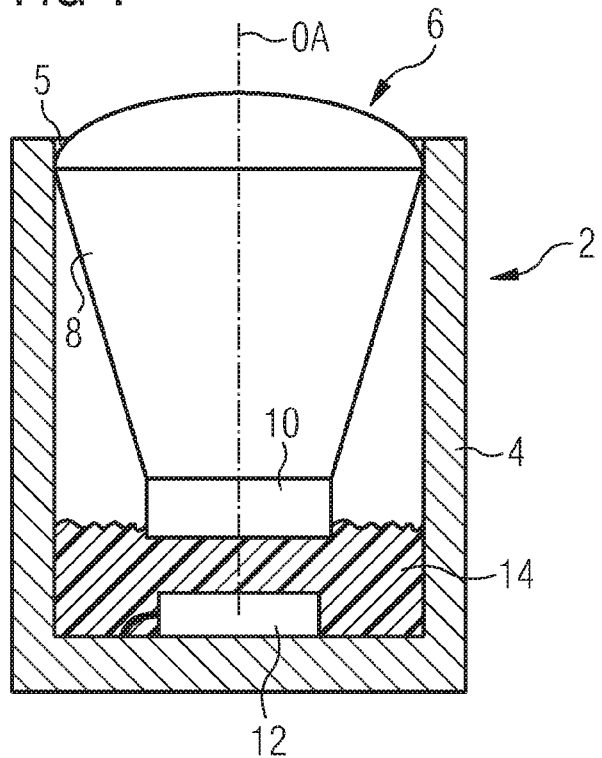
FIG. 1, shows a first embodiment of an LED display device.

An LED display device 2 (FIG. 1) comprises a housing 4 with an opening 5. Furthermore, the LED display device 2 comprises a lens arrangement 6. The lens arrangement 6 is formed from a lens 8 and a transparent transition body 10. Furthermore, the LED display device comprises an LED 12.

The LED 12 is placed in the housing 4 in such a way that the radiation that is radiated in a main radiation direction of the LED 12 leaves the housing 4 through the opening 5. In this connection, this means that the radiation of the LED 12 can be radiated directly from the opening 5 of the housing 4, and/or that a reflector can be placed in the housing 4, which reflects the radiation in such a way that it is radiated from the opening 5 of the housing 4.

The LED 12 preferably comprises a semiconductor chip. The semiconductor chip is connected to a circuit in a controllable manner. If a voltage is applied to the LED 12, then this radiation, preferably, light in the visible range, radiates. The LED 12 can be embedded in a casting compound 14. The casting compound 14 can comprise, for example, silicone and/or plastic. The casting compound 14 is used to hold the LED 12 in its position, to protect the LED 12, to influence the radiation radiated from the LED 12, and/or to increase the angular range of the radiated radiation.

The lens arrangement 6 is preferably situated in such a way that radiation radiated from the LED 12 must penetrate the lens arrangement 6, before it leaves the housing 4 of the LED display device 2. The lens 8 has an optical axis. The optical axis penetrates a first lens surface of the lens 8. The first lens surface is coupled with the transparent transition body 10. The transparent transition body 10 also has an optical axis. The optical axes of the lens 8 and the transparent transition body 10 can be parallel to one another. Preferably, the lens 8 and the transparent body 10 are coupled with one another in such a way that their optical axes are identical and thus form optical axis OA of the lens arrangement 6.

Preferably, the lens 8 and the transparent transition body 10 are coupled firmly with one another so that a two-component lens is formed by the lens 8 and the transparent transition body 10. The two-component lens can also be designated as a lens arrangement 6. The first surface of the lens 8 and the surface of the transparent transition body 10, which is coupled on the first surface of the lens 8, are preferably designed in such a way that the two surfaces abut one another as much as possible without air occlusions.

The lens 8 is essentially used to influence the beam guidance of the lens arrangement 6. Therefore, the lens 8 preferably comprises a material with a stable shape. The material with a stable shape can comprise, for example, glass, plastic, and/or silicone The transparent transition body 10 is preferably more temperature-resistant than the lens 8. Therefore, the transparent transition body 10 preferably comprises a temperature-resistant material. The temperature-resistant material withstands, for example, temperatures of 125° C. and/or more. Less demanding requirements, however, are made of the shape stability of the transparent transition body 10 and the radiation sensitivity of the transparent transition body 10, that is, the characteristics that affect the stability regarding the radiation density of the radiation radiated by the light source, than the requirements for the lens 8. Preferably, the transparent transition body 10 is more malleable than the lens 8. If the transparent transition body 10 and the lens 8 are put together, then this can contribute to the two surfaces of the lens 8 and the transparent transition body 10 lying next to one another without air influences.

Figure 2:
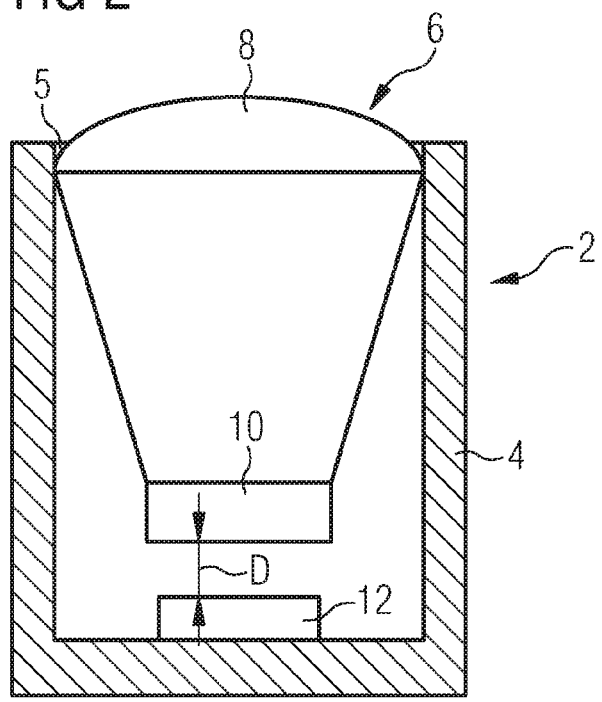
FIG. 2, shows a second embodiment of the LED display device.

The LED display device 2 can also be formed without the casting compound 14 (FIG. 2). The transparent transition body 10 then has, for example, a prespecified positive distance D from the LED 12. This causes the radiation radiated by the LED 12 to have a high radiation density on penetration of the lens arrangement 6 and to radiate onto a relatively small surface.

Alternatively, the transparent transition body can also be mounted on the LED 12 (FIG. 3). A similar optical effect as with the transparent casting compound 14 is attained. Furthermore, this makes it possible, if the transparent transition body 10 is made in a shapeable manner, to have a tolerance compensation between the lens arrangement 6 and the housing 4. Furthermore, with a loading of the lens arrangement 6 in the direction parallel to a bottom of the housing 4 and/or a direction perpendicular to the bottom of the housing 4, the shapeable transparent transition body 10 can be used as a compensation body. It is then deformed and does not transfer the load to the LED 12.

Alternatively or additionally, the transparent transition body 10 can be formed in such a way that it surrounds the lens 8, at least in part, in the radial direction (FIG. 4). This can contribute to additional shielding of the lens 8 from thermal stress. Furthermore, this can contribute to obtaining a particularly good coupling between the lens 8 and the transparent transition body 10.

Alternatively or additionally, the transparent transition body 10 can have a holding body 16 (FIG. 5). The holding body 16 then preferably projects into a recess 18 of the lens 8. This can further improve the coupling between the lens 8 and the transparent transition body 10. Furthermore, this can contribute to an expanded beam guidance. Alternatively or additionally, the transparent transition body 10 can also have a recess, and the lens 8, a corresponding holding body.

The invention is not limited by the description with the aid of the embodiment examples. Rather, the invention comprises each new feature and each combination of features, which, in particular, includes each combination of features in the patent claims, even if this feature or this combination is not explicitly indicated in the patent claims or embodiment examples. For example, several lens arrangements 6 and/or LEDs 12 can be provided in the LED display device 2. Accordingly, the housing 4 can comprise several openings. Furthermore, the transparent transition body 10 can have the holding body 16 without the transparent transition body 10 surrounding the lens 8 at least partially in the radial direction.

The invention claimed is:

1. An optical device comprising:
   a light emitting diode;
   a lens having a first lens surface and an optical axis that penetrates the first lens surface of the lens; and
   a transparent transition body firmly coupled to the lens at the first lens surface and between the lens and the light emitting diode and in direct contact with both the lens and the light emitting diode,
   wherein side surfaces of the light emitting diode are completely free from a material of the transparent transition body,
   wherein the first lens surface is completely covered by the material of the transparent transition body and the material of the transparent body projects beyond the first lens surface in a lateral direction, wherein the lateral direction runs at least in places parallel to the first lens surface,
   wherein the transparent transition body being more temperature-resistant than the lens and having an optical axis that is parallel to the optical axis of the lens, wherein the transparent transition body at least partially surrounds the lens in a radial direction; and
   wherein the transparent transition body laterally envelops an end section of the lens which faces the LED.

2. The optical device according to claim 1, wherein the optical axis of the lens corresponds to the optical axis of the transparent transition body and wherein the two optical axes form an optical axis of a lens arrangement.

3. The optical device according to claim 1, wherein the lens is more resistant to deformation than the transparent transition body.

4. The optical device according to claim 1, wherein the lens has at least one recess and wherein the transparent transition body has at least one holding body that protrudes into the at least one recess of the lens.

5. The optical device according to claim 1, wherein the transparent transition body is suitable for protecting the lens from radiation-based influences.

6. The optical device according to claim 5, wherein the transparent transition body is provided for placement between the lens and the light emitting diode.

7. The optical device according to claim 6, wherein the transparent transition body is suitable for reducing a radiation density on the lens.

8. The optical device according to claim 1, wherein the transparent transition body is in direct contact to a radiation exit surface of the light emitting diode.

9. The optical device according to claim 1, wherein the lens and the transparent transition body are coupled firmly with one another so that a two-component lens is formed by the lens and the transparent transition body.

10. An LED display device comprising:
    a housing that comprises an opening;
    a light emitting diode (LED) located in the housing in such a way that radiation that is radiated in a main radiation direction of the LED exits through the opening of the housing;
    a lens having an optical axis that penetrates a first lens surface of the lens; and
    a transparent transition body firmly coupled with the lens between the lens and the LED and in direct contact with both the lens and the LED,
    wherein side surfaces of the LED are completely free from a material of the transparent transition body,
    wherein the first lens surface is completely covered by the material of the transparent transition body and the material of the transparent body projects beyond the first lens surface in a lateral direction, wherein the lateral direction runs at least in places parallel to the first lens surface,
    wherein the transparent transition body is more temperature-resistant than the lens and has an optical axis that is parallel to the optical axis of the lens, the lens and transparent transition body being located in such a way that the radiation emitted from the LED in the main radiation direction penetrates the transparent transition body and the lens, wherein the transparent transition body at least partially surrounds the lens in a radial direction; and
    wherein the transparent transition body laterally envelops an end section of the lens which faces the LED.

11. The LED display device according to claim 10, wherein the transparent transition body is mounted on the LED.

12. The LED display device according to claim 10, wherein the LED is at least partially sheathed by a transparent casting compound.

13. The LED display device according to claim 10, wherein the optical axis of the lens corresponds to the optical axis of the transparent transition body and wherein the two optical axes form an optical axis of the LED display device.

14. The LED display device according to claim 10, wherein the lens is more resistant to deformation than the transparent transition body.

15. The LED display device according to claim 10, wherein the lens has at least one recess and wherein the transparent transition body has at least one holding body that protrudes into a recess of the lens.

16. The LED display device according to claim 10, wherein the transparent transition body is suitable for protecting the lens from radiation-based influences.

17. The LED display device according to claim 10, wherein the transparent transition body is suitable for reducing a radiation density on the lens.

18. The LED display device according to claim 10, further comprising a further LED located in the housing.

* * * * *